United States Patent
Yoon et al.

(10) Patent No.: US 6,731,560 B2
(45) Date of Patent: May 4, 2004

(54) REFRESH APPARATUS FOR SEMICONDUCTOR MEMORY DEVICE, AND REFRESH METHOD THEREOF

(75) Inventors: Seok Cheol Yoon, Chungcheongbuk-do (KR); Jae Jin Lee, Ichon-shi (KR); Sang Hee Kang, Kimhae-shi (KR); Chul Ho Kim, Sungnam-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/313,445

(22) Filed: Dec. 6, 2002

(65) Prior Publication Data

US 2003/0107939 A1 Jun. 12, 2003

(30) Foreign Application Priority Data

Dec. 7, 2001 (KR) .................................... 2001-0077404

(51) Int. Cl.$^7$ ................................................. G11C 7/00
(52) U.S. Cl. ........................ 365/222; 365/200; 365/201
(58) Field of Search ................................ 365/222, 200, 365/201

(56) References Cited

U.S. PATENT DOCUMENTS

| | | | |
|---|---|---|---|
| 5,410,507 A | * | 4/1995 | Tazunoki et al. ...... 365/189.09 |
| 5,793,685 A | * | 8/1998 | Suma ...................... 365/201 |
| 6,195,300 B1 | | 2/2001 | Kirihata et al. |
| 6,545,925 B2 | * | 4/2003 | Lee ......................... 365/222 |

OTHER PUBLICATIONS

British Patent Office Search Report dated May 2, 2003.

* cited by examiner

Primary Examiner—Vu A. Le
(74) Attorney, Agent, or Firm—Marshall, Gerstein & Borun LLP (57) ABSTRACT

A refresh apparatus for a semiconductor memory device and a refresh method thereof that can reduce a test time by simultaneously refreshing a normal cell and a redundant cell in one test mode is disclosed. The refresh apparatus for the semiconductor memory device may include a redundant cell refresh signal generator for generating a redundant cell refresh signal for refreshing a redundant cell when a refresh is requested in a test mode, a wordline enable signal generator for generating a normal main wordline enable signal and a redundant main wordline enable signal in response to the redundant cell refresh signal in a redundant cell test mode and a wordline driver for simultaneously refreshing the normal and redundant cells by simultaneously driving a normal main wordline and a redundant main wordline in response to the redundant cell refresh signal, the normal main wordline enable signal, the redundant main wordline enable signal and a row address in the redundant cell test mode.

13 Claims, 8 Drawing Sheets

REFRESH APPARATUS FOR SEMICONDUCTOR MEMORY DEVICE, AND REFRESH METHOD THEREOF

BACKGROUND

1. Technical Field

The present invention relates to a refresh apparatus for a semiconductor memory device and a refresh method thereof and, in particular, to a refresh apparatus for a semiconductor memory device and a refresh method thereof that can refresh a normal cell and a redundant cell by enabling a normal main wordline and a redundant main wordline in one test mode.

2. Description of the Related Art

In general, a static random access memory (SRAM) cell includes normal cells and redundant cells. When one of the normal cells has a defect, the defective normal cell is replaced by a redundant cell. When such a replacement is made, it is necessary to determine if the redundant cell replacing the defective normal cell has a defect itself. If the redundant cell is defective, the defective redundant cell is replaced by another redundant cell. To replace the cell having a defect with a redundant cell, both the normal cell and the redundant cell must be tested. However, because conventionally the normal cell and the redundant cell are individually tested (namely, tested by changing a test mode), test time is increased. Accordingly, to reduce the test time, the normal cell and the redundant cell are tested simultaneously in one test mode. However, the redundant cell cannot be refreshed in the test mode.

Figure 1:
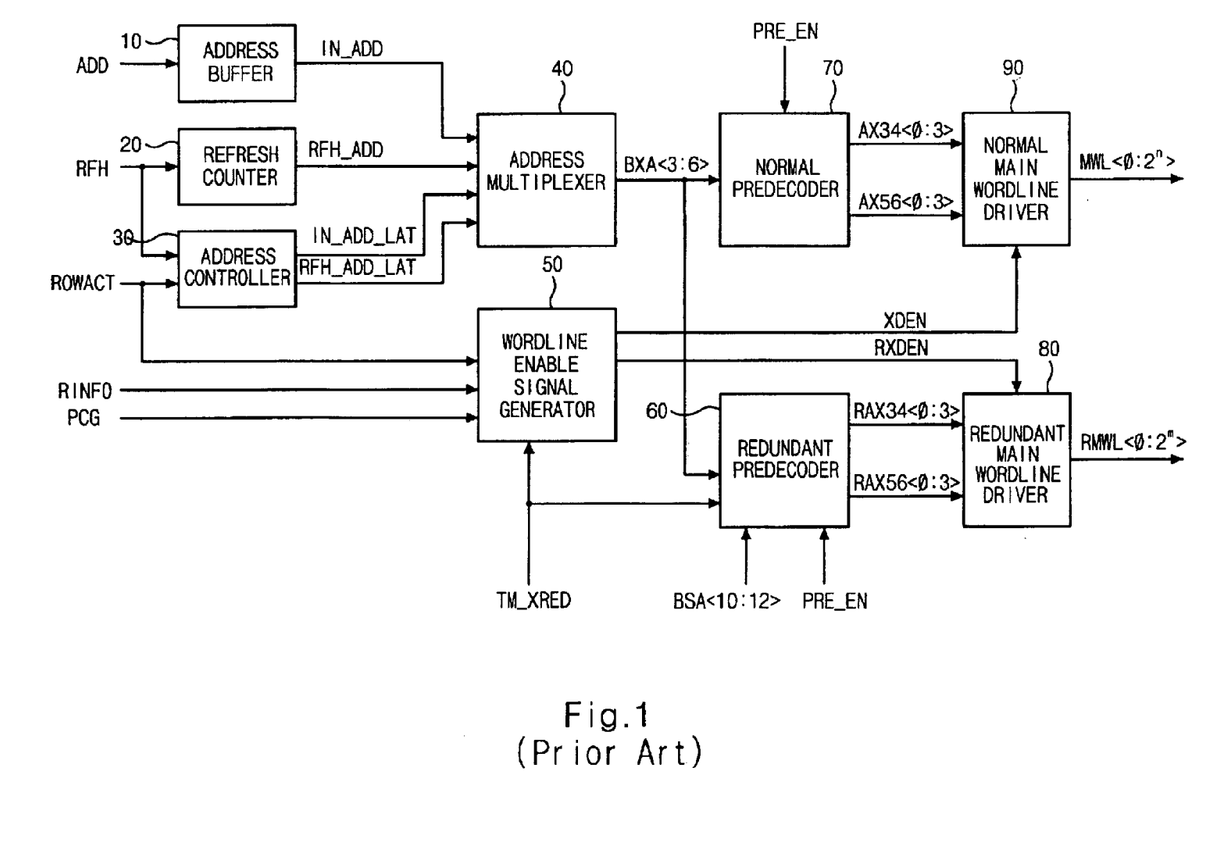
FIG. 1 is a block diagram illustrating a conventional refresh apparatus for a semiconductor memory device.

A conventional refresh apparatus for a semiconductor memory device having the aforementioned problem is described in detail with reference to FIG. 1. As shown in FIG. 1, the conventional refresh apparatus for a semiconductor memory device includes an address buffer 10, a refresh counter 20, an address controller 30, an address multiplexer 40, a wordline enable signal generator 50, a redundant predecoder 60, a normal predecoder 70, a redundant main wordline driver 80 and a normal main wordline driver 90.

The refresh counter 20 of the refresh apparatus refreshes the data in the memory device at periodic intervals such as, for example, every 64 milliseconds (ms) so that the dynamic random access memory (DRAM) cell can maintain the data stored therein. However, the refresh counter 20 is capable of refreshing only the normal cells. Accordingly, the normal cells are refreshed, but the redundant cells are not refreshed.

SUMMARY OF THE DISCLOSURE

It is an object of the present invention to reduce a test time by simultaneously refreshing a normal cell and a redundant cell in one test mode.

According to a first aspect, a refresh apparatus for a semiconductor memory device may include an address multiplexer for generating a row address for performing a refresh operation in response to a refresh request signal, a redundant cell refresh signal generator for generating a redundant cell refresh signal in response to the refresh request signal and a test mode signal, and a wordline enable signal generator for generating a normal main wordline enable signal and a redundant main wordline enable signal in response to the redundant cell refresh signal in a redundant cell test mode. The refresh apparatus may also include a wordline driver circuit for simultaneously refreshing normal cell and the redundant cell by simultaneously driving a normal main wordline and a redundant main wordline in response to the row address, the redundant cell refresh signal, the normal main wordline enable signal and the redundant main wordline enable signal in the redundant cell test mode.

According to a second aspect, a refresh method of a semiconductor memory device may include generating a row address for performing a refresh operation in response to a refresh request signal, generating a redundant cell refresh signal in response to the refresh request signal and a test mode signal, and generating a normal main wordline enable signal and a redundant main wordline enable signal in response to the redundant cell refresh signal in a redundant cell test mode. The refresh method may also include simultaneously refreshing a normal cell and a redundant cell by simultaneously driving a normal main wordline and a redundant main wordline in response to the row address, the redundant cell refresh signal, the normal main wordline enable signal and the redundant main wordline enable signal in the redundant cell test mode.

DETAILED DESCRIPTION OF THE PRESENTLY PREFERRED EMBODIMENTS

Figure 2:
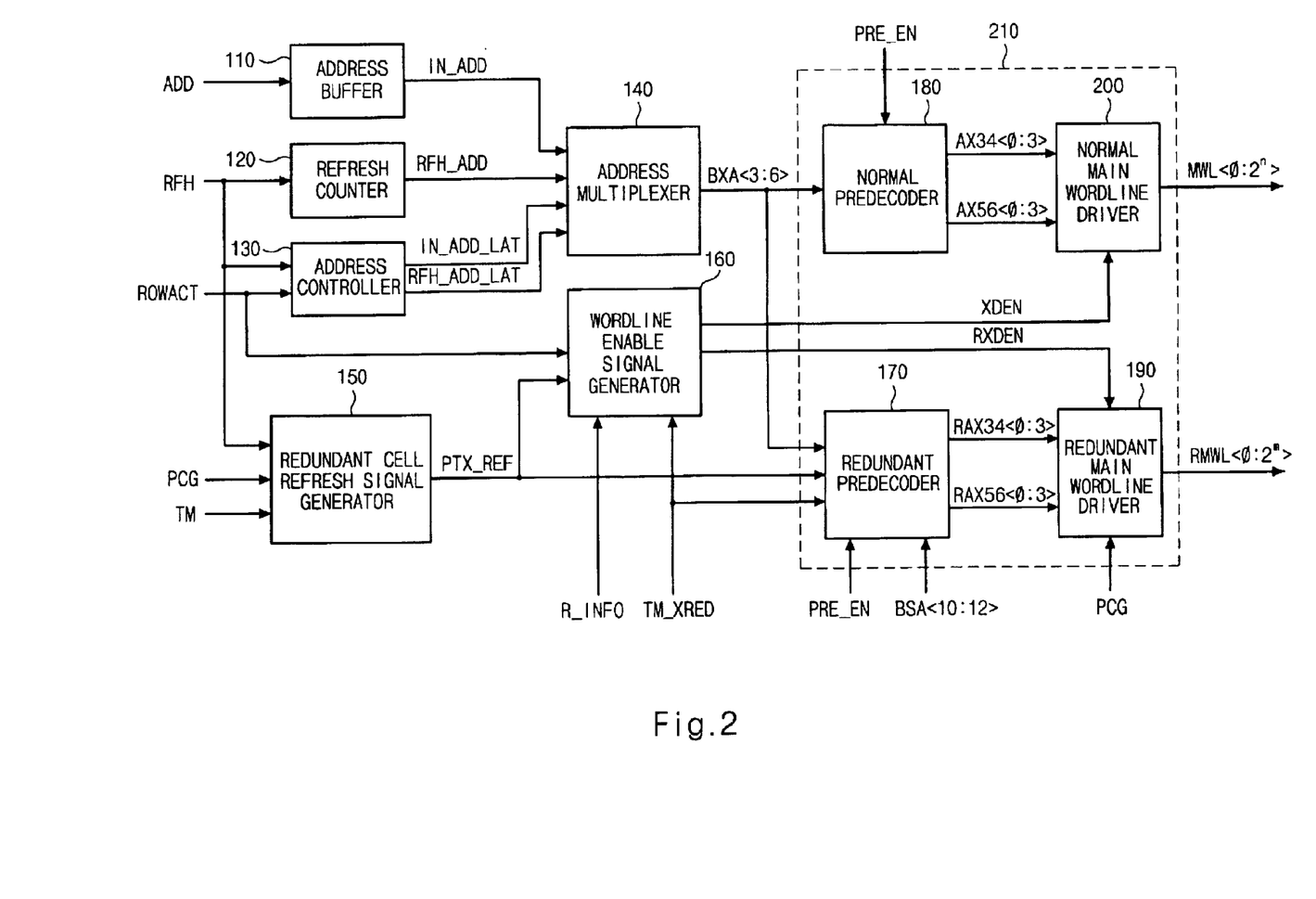
FIG. 2 is a block diagram illustrating a refresh apparatus for a semiconductor memory device.

As illustrated in FIG. 2, the refresh apparatus for a semiconductor memory device includes an address buffer 110, a refresh counter 120, a refresh address controller 130, an address multiplexer 140, a redundant cell refresh signal generator 150, a wordline enable signal generator 160 and a wordline driver circuit 210. The wordline driver circuit 210 may include a redundant predecoder 170, a normal predecoder 180, a redundant main wordline driver 190 and a normal main wordline driver 200.

The address buffer 110 buffers N external address ADD and generates N internal address IN_ADD. The refresh counter 120 receives a refresh request signal RFH and generates N refresh address RFH_ADD.

The refresh address controller 130 receives a row active signal ROWACT and a refresh request signal RFH, and generates an internal address latch signal IN_ADD_LAT for controlling the internal address IN_ADD and a refresh address latch signal RFH_ADD_LAT for controlling the refresh address REF_ADD.

The address multiplexer 140 multiplexes the N internal address IN_ADD and the N refresh address RHF_ADD, and generates row address BXA<3:6> in response to the internal address latch signal IN_ADD_LAT and the refresh address latch signal RHF_ADD_LAT.

The redundant cell refresh signal generator 150 generates a redundant cell refresh signal PTX_REF for refreshing a redundant cell in response to a precharge signal PCG, the refresh request signal RFH and a test mode signal TM.

The wordline enable signal generator 160 combines the row active signal ROWACT, a repair signal R_INFO, a redundant cell test mode signal TM_XRED and the redundant cell refresh signal PTX_REF, and generates a normal main wordline enable signal XDEN for enabling a normal main wordline and a redundant main wordline enable signal RXDEN for enabling a redundant main wordline.

The redundant predecoder 170 decodes the row address BXA<3:6>, the redundant cell test mode signal TM_XRED, the redundant cell refresh signal PTX_REF, block select address BSA<10:12> and a predecoder enable signal PRE_EN, and generates decoded row address RAX34<0:3> and RAX56<0:3>.

The normal predecoder 180 decodes the row address BXA<3:6> and the predecoder enable signal PRE_EN, and generates decoded row address AX34<0:3> and AX56<0:3>.

The redundant main wordline driver 190 drives redundant main wordlines RMWL<0:2$^n$> (wherein n is a random integer) in response to the precharge signal PCG, the decoded row address RAX34<0:3> and RAX56<0:3> and the redundant main wordline enable signal RXDEN.

The normal main wordline driver 200 drives normal main wordlines MWL<0:2$^m$> (wherein m is a random integer) in response to the precharge signal PCG, the decoded row address AX34<0:3> and AX56<0:3> and the normal main wordline enable signal XDEN.

The components and operation of the respective units 150–200 of FIG. 2 are now explained in further detail with reference to FIGS. 3 to 8.

Figure 3:
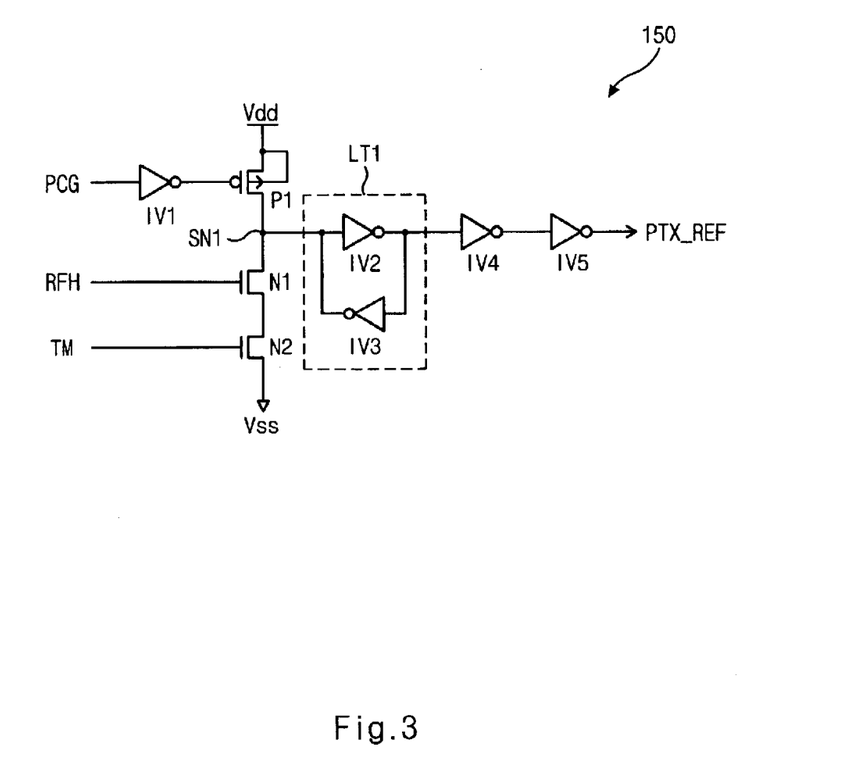
FIG. 3 is a circuit diagram illustrating the redundant cell refresh signal generator of FIG. 2.

In the redundant cell refresh signal generator 150 shown in FIG. 3, an inverter IV1 inverts the precharge signal PCG, a PMOS transistor P1 has its source and drain connected respectively to a power voltage Vdd and a node SN1 and its gate connected to receive the output signal from the inverter IV1. NMOS transistors N1 and N2 are connected in series between the node SN1 and a ground voltage Vss, and have their gates connected to receive the refresh request signal RFH and the test mode signal TM, respectively. A latch circuit LT1 is connected between the node SN1 and an input terminal of an inverter IV4 for latching the signal of the node SN1. Inverters IV4 and IV5 invert the output signal from the latch circuit LT1 and generate the redundant cell refresh signal PTX_REF.

The redundant cell refresh signal generator 150 transits the redundant cell refresh signal PTX_REF at a low level in a precharge state. Namely when the precharge signal PCG is at a high level and the refresh request signal RFH and the test mode signal TM have a low level. Conversely, when the precharge signal PCG is at a low level and the refresh request signal RFH and the test mode signal TM are at a high level, the redundant cell refresh signal generator 150 transits the redundant cell refresh signal PTX_REF to a high level.

Figure 4:
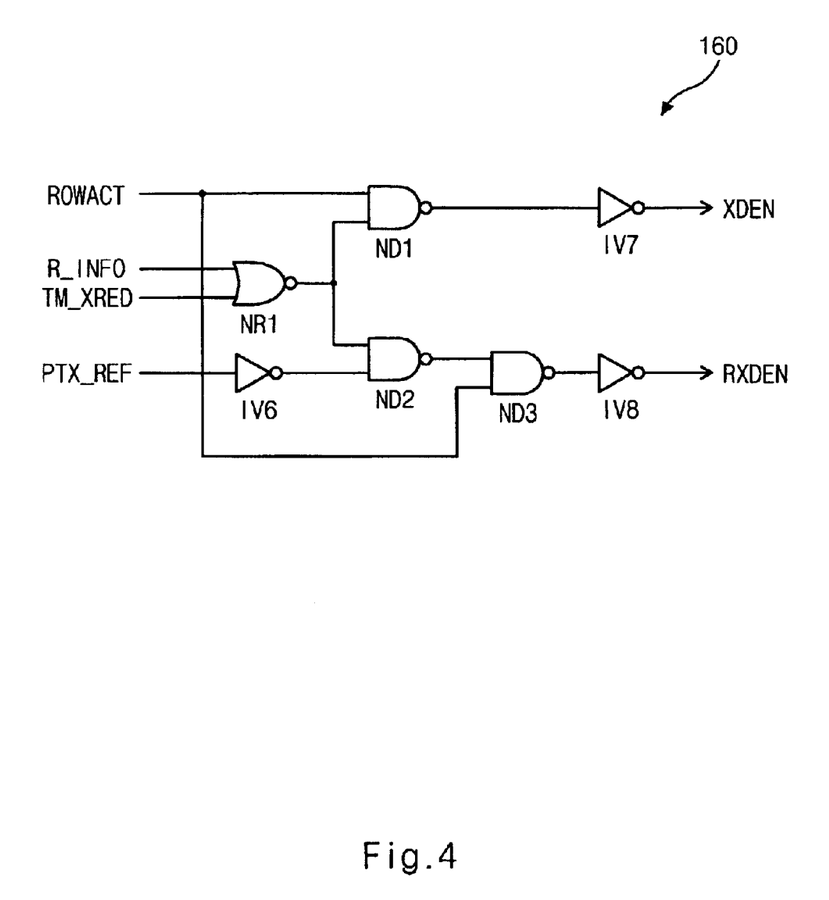
FIG. 4 is a circuit diagram illustrating the wordline enable signal generator of FIG. 2.

In the wordline enable signal generator 160 of FIG. 4, a NOR gate NR1 NORs the repair signal R_INFO and the redundant cell test mode signal TM_XRED. A NAND gate ND1 NANDs the row active signal ROWACT and the output signal from the NOR gate NR1. An inverter IV7 inverts the output signal from the NAND gate ND1 and outputs the normal main wordline enable signal XDEN. An inverter IV6 inverts the redundant cell refresh signal PTX_REF. A NAND gate ND2 NANDs the output signal from the NOR gate NR1 and the output signal from the inverter IV6. A NAND gate ND3 NANDs the output signal from the NAND gate ND2 and the row active signal ROWACT, and an inverter IV8 inverts the output signal from the NAND gate ND3 and outputs the redundant main wordline enable signal RXDEN.

When the repair signal R_INFO, the redundant cell test mode signal TM_XRED and the redundant cell refresh signal PTX_REF are at a low level, if the row active signal ROWACT is inputted at a high level, the wordline enable signal generator 160 transits the normal main wordline enable signal XDEN to a high level and the redundant main wordline enable signal RXDEN to a low level, thereby disabling the redundant main wordline. Conversely, when the repair signal R_INFO and the redundant cell test mode signal TM_XRED are at a low level and the redundant cell refresh signal PTX_REF is at a high level, if the row active signal ROWACT is inputted at a high level, the wordline enable signal generator 160 transits the normal main wordline enable signal XDEN and the redundant main wordline enable signal RXDEN to a high level, thereby enabling the redundant main wordline.

Figure 5:
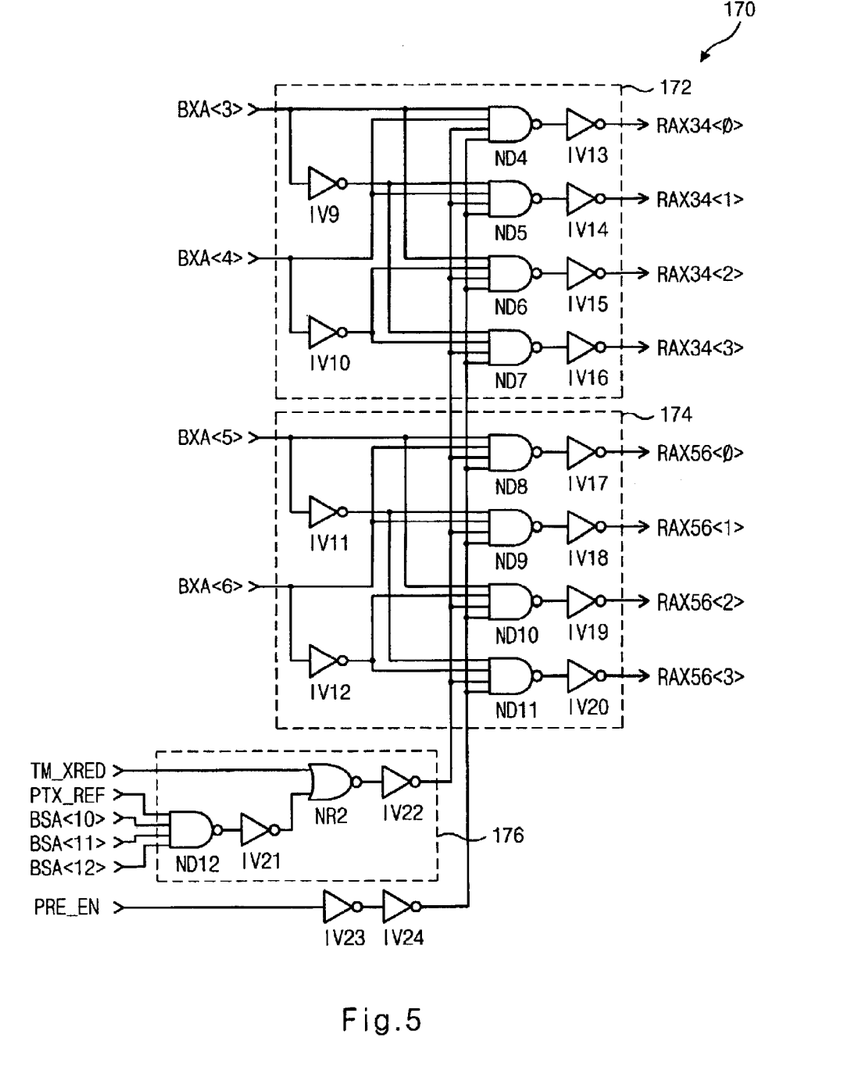
FIG. 5 is a circuit diagram illustrating the normal predecoder of FIG. 2.

As depicted in FIG. 5, the redundant predecoder 170 includes decoding units 172 and 174, a refresh block select unit 176 and inverters IV23 and IV24 for inverting a predecoder enable signal PRE_EN. The refresh block select unit 176 selects a block to be refreshed in response to the redundant cell test mode signal TM_XRED, the redundant cell refresh signal PTX_REF and the block select address BSA<10:12>. The decoding unit 172 decodes the row address BXA<0:3>, the output signal from the refresh block select unit 176 and the predecoder enable signal PRE_EN, and generates the decoded row address RAX34<0:3>. The decoding unit decodes the row address BXA<5:6>, the output signal from the refresh block select unit 176 and the predecoder enable signal PRE_EN, and generates the decoded row address RAX56<0:3>.

In the decoding unit 172, inverters IV9 and IV10 invert the row address BXA<3> and BXA<4>, a NAND gate ND4 NANDs the row address BXA<3> and BXA<4>, the output signal from the refresh block select unit 176 and the output signal from the inverter IV24. An inverter IV13 inverts the output signal from the NAND gate ND4 and outputs the decoded row addre RAX34<0> and a NAND gate ND5 NANDs the output signal from the inverter IV9, the row address BXA<4>, the output signal from the refresh block select unit 176 and the output signal from the inverter IV24. An inverter IV14 inverts the output signal from the NAND gate ND5 and outputs the decoded row address RAX34<1> and a NAND gate ND6 NANDs the row address BXA<3>, the output signal from the inverter IV10, the output signal from the refresh block select unit 176 and the output signal from the inverter IV24. An inverter IV15 inverts the output signal from the NAND gate ND6 and outputs the decoded row address RAX34<2>, a NAND gate ND7 NANDs the output signals from the inverters IV9 and IV10, the output signal from the refresh block select unit 176, and the output signal from the inverter IV24, and an inverter IV16 inverts the output signal from the NAND gate ND7 and outputs the decoded row address RAX34<3>.

In the decoding unit 174, inverters IV11 and IV12 invert the row address BXA<5> and BXA<6> and a NAND gate ND8 NANDs the row address BXA<5> and BXA<6>, the output signal from the refresh block select unit 174 and the output signal from the inverter IV24. An inverter IV17 inverts the output signal from the NAND gate ND8 and outputs the decoded row address RAX56<0> and a NAND gate ND9 NANDs the output signal from the inverter IV11, the row address BXA<6>, the output signal from the refresh block select unit 176 and the output signal from the inverter IV24. An inverter IV18 inverts the output signal from the NAND gate ND9 and outputs the decoded row address RAX56<1> and a NAND gate ND10 NANDs the row address BXA<5>, the output signal from the inverter IV12, the output signal from the refresh block select unit 176 and the output signal from the inverter IV24. An inverter IV19 inverts the output signal from the NAND gate ND10 and outputs the decoded row address RAX56<2> and a NAND gate ND11 NANDs the output signals from the inverters IV11 and IV12, the output signal from the refresh block select unit 176, and the output signal from the inverter IV24. An inverter IV20 inverts the output signal from the NAND gate ND11 and outputs the decoded row address RAX56<3>.

In the refresh block select unit 176, a NAND gate ND12 NANDs the redundant cell refresh signal PTX_REF and the block select address BSA<10:12> and an inverter IV21 inverts the output signal from the NAND gate ND12. A NOR gate NR2 NORs the output signal from the inverter IV21 and the redundant cell test mode signal TM_XRED and an inverter IV22 inverts the output signal from the NOR gate NR2.

The operation of the redundant predecoder 170 is now explained. When the refresh block select unit 176 receives the redundant cell refresh signal PTX_REF and the block select address BSA<10:12> having high levels and receives the redundant cell test mode signal TM_XRED having a low level, the refresh block select unit 176 produces a high level output signal.

When the refresh block select unit 176 produces a high level output signal and when the decoding unit 172 receives the row address BXA<3:6> having high levels and the output signal from the refresh block select unit 176, as well as the predecoder enable signal PRE_EN having a high level, the decoding unit 172 outputs the decoded row address RAX34<0> and RAX56<0> having high levels and the decoded row address RAX34<1:3> and RAX56<1:3> having low levels.

Figure 6:
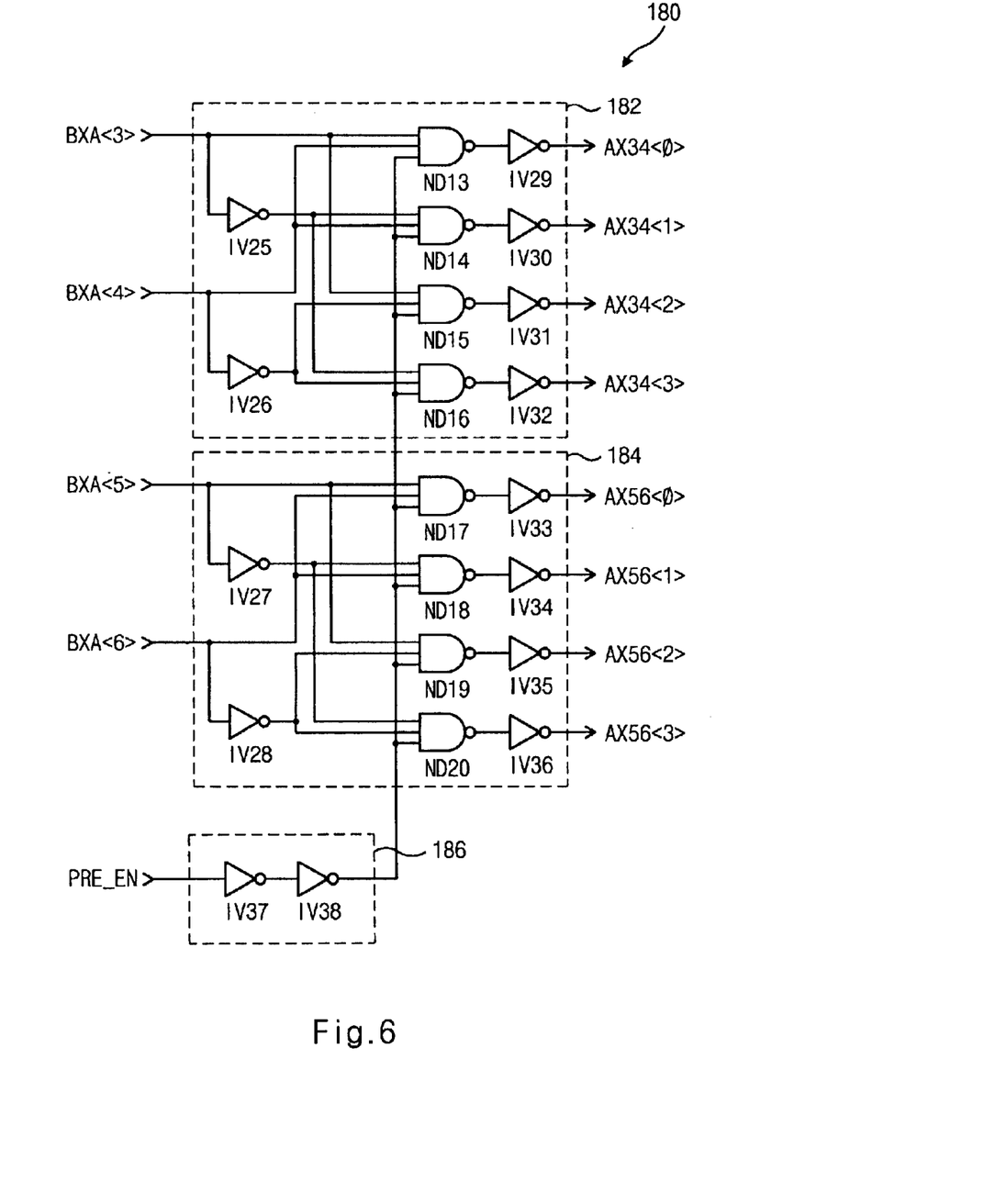
FIG. 6 is a circuit diagram illustrating the redundant predecoder of FIG. 2.

As shown in FIG. 6, the normal predecoder 180 includes decoding units 182 and 184, and inverters IV37 and IV38 for inverting the predecoder enable signal PRE_EN. The decoding unit 182 decodes the row address BXA<3:4> and the predecoder enable signal PRE_EN, and generates the decoded row address AX34<0:3>. The decoding unit 184 decodes the row address BXA<5:6> and the predecoder enable signal PRE_EN, and generates the decoded row address AX56<0:3>.

In the decoding unit 182, inverters IV25 and IV26 invert the row address BXA<3> and BXA<4>, respectively. A NAND gate ND13 NANDs the row address BXA<3> and BXA<4> and the output signal from the inverter IV38. An inverter IV29 inverts the output signal from the NAND gate ND13 and outputs the decoded row address AX34<0>. A NAND gate ND14 NANDs the output signal from the inverter IV25, the row address BXA<4>, and the output signal from the inverter IV38. An inverter IV30 inverts the output signal from the NAND gate ND14 and outputs the decoded row address AX34<1>. A NAND gate ND15 NANDs the row address BXA<3>, the output signal from the inverter IV26 and the output signal from the inverter IV38. An inverter IV31 inverts the output signal from the NAND gate ND15 and outputs the decoded row address AX34<2>. A NAND gate ND16 NANDs the output signals from the inverters IV25 and IV26 and the output signal from the inverter IV38 and an inverter IV32 inverts the output signal from the NAND gate ND16 to output the decoded row address AX34<3>.

In the decoding unit 184, inverters IV27 and IV28 invert the row address BXA<5> and BXA<6>, respectively. A NAND gate ND 17 NANDs the row address BXA<5> and BXA<6> and the output signal from the inverter IV38. An inverter IV33 inverts the output signal from the NAND gate ND17 to output the decoded row address AX56<0>. A NAND gate ND18 NANDs the output signal from the inverter IV27, the row address BXA<6> and the output signal from the inverter IV38 and an inverter IV34 inverts the output signal from the NAND gate ND18 to ouput the decoded row address AX56<1>. A NAND gate ND19 NANDs the row address BXA<5>, the output signal from the inverter IV28 and the output signal from the inverter IV38. An inverter IV35 inverts the output signal from the NAND gate ND19 to output the decoded row address AX56<2>. A NAND gate ND20 NANDs the output signals from the inverters IV27 and IV28 and the output signal from the inverter IV38. An inverter IV36 inverts the output signal from the NAND gate ND20 and outputs the decoded row address AX56<3>.

The operation of the normal predecoder 180 is now explained. When the decoding unit 182 receives the row address BXA<3:6> having low levels and the predecoder enable signal PRE_EN having a high level, the decoding unit 182 outputs the decoded row address AX34<0:2> at low levels and the decoded row address AX34<3> at a high level. When the decoding unit 184 receives the row address BXA<3:6> having low levels and the predecoder enable signal PRE_EN at a high level, the decoding unit 184 outputs the decoded row address AX56<0:2> at low levels and the decoded row address AX56<3> at a high level.

Figure 7:
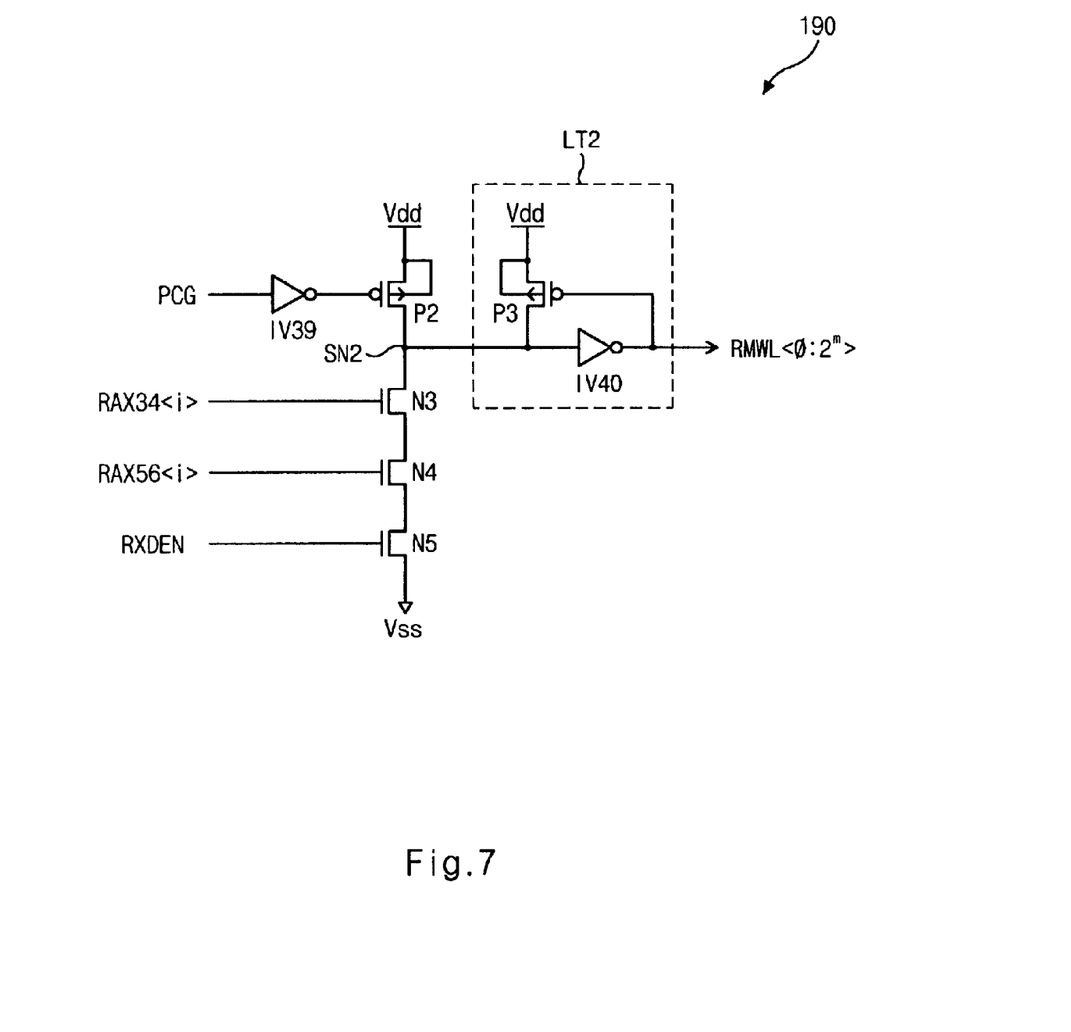
FIG. 7 is a circuit diagram illustrating the normal main wordline driver of FIG. 2.

As shown in FIG. 7, in the redundant main wordline driver 190 an inverter IV39 inverts the precharge signal PCG, a PMOS transistor P2 has its source and drain connected respectively to the power voltage Vdd and a node SN2 and its gate connected to receive the output signal from the inverter IV39. NMOS transistors N3, N4 and N5 are connected in series between the node SN2 and the ground voltage Vss. The NMOS transistors N3, N4 and N5 have their gates connected to receive the decoded row address RAX34<i>, RAX56 <i> and the redundant main wordline enable signal RXDEN. A latch circuit LT2, for driving the redundant main wordlines RMWL<0:2$^m$> by latching the signal of the node SN2, is connected between the node SN2 and an output terminal.

The latch circuit LT2 includes a PMOS transistor P3 having its source connected to the power voltage Vdd and its gate connected to receive an output signal from an inverter IV40. An input terminal of the inverter IV40 is connected to the drain of the PMOS transistor P3, which is connected to node SN2.

The operation of the redundant main wordline driver 190 is now explained. When the redundant main wordline driver 190 receives the precharge signal PCG having a low level and the decoded row address RAX34<0> and RAX56<0> and the redundant main wordline enable signal RXDEN having high levels, the redundant main wordline driver 190 drives the redundant main wordlines RMWL<0:2$^m$>. The redundant cell can be refreshed by the redundant main wordlines RMWL<0:2$^m$>.

Figure 8:
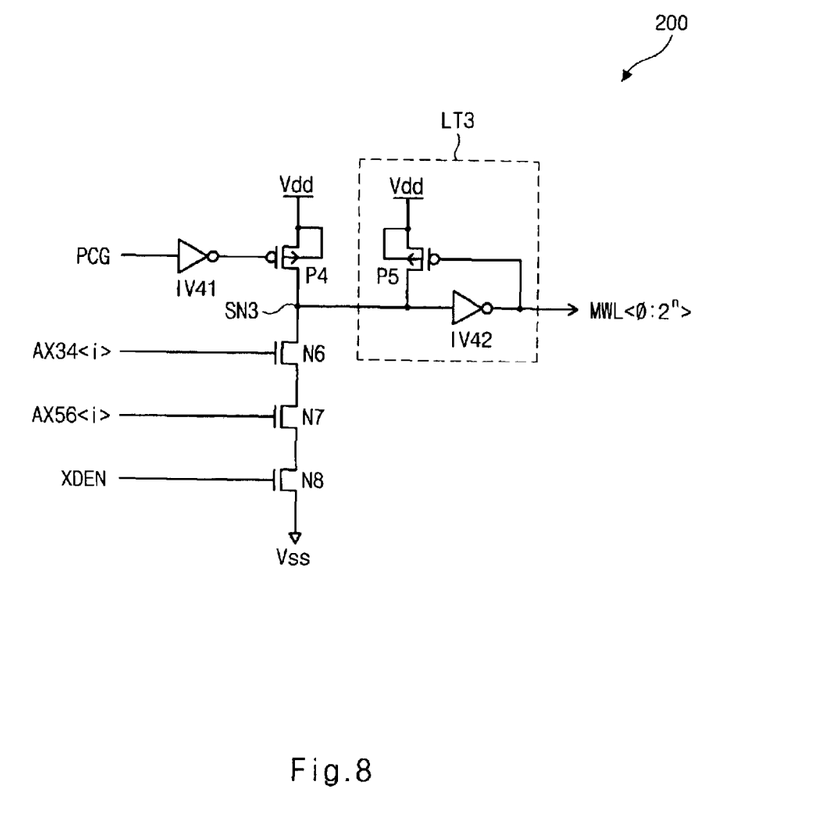
FIG. 8 is a circuit diagram illustrating the redundant main wordline driver of FIG. 2.

As shown in FIG. 8, the normal main wordline driver 200 includes an inverter IV41 that inverts the precharge signal PCG, a PMOS transistor P4 having its source and drain connected respectively to the power voltage Vdd and a node SN3 and its gate connected to receive the output signal from the inverter IV41. NMOS transistors N6, N7 and N8 are connected in series between the node SN3 and the ground voltage Vss, and have their gates connected to receive the decoded row address AX34<i> and AX56<i> and the normal main wordline enable signal XDEN. A latch circuit LT3 for driving the normal main wordline MWL<0:2$^n$> by latching the signal of the node SN3 is connected between the node SN3 and an output terminal.

The latch circuit LT3 includes a PMOS transistor P5 having its source connected to the power voltage Vdd and its gate connected to receive an output signal from an inverter IV42. An input terminal of the inverter IV42 is connected to the drain of the PMOS transistor P5.

The operation of the normal main wordline driver 200 is now explained. When the normal main wordline driver 200 receives the precharge signal PCG having a low level and the decoded row address AX34<i> and AX56<i> and the main wordline enable signal XDEN having high levels, the normal main wordline driver 200 drives one of the normal main wordlines MWL<0:2$^n$>. The normal cell is refreshed by the signals driving the normal main wordlines MWL<0:2$^m$>.

As discussed earlier, the normal cell and the redundant cell can be refreshed simultaneously or at nearly the same time by driving the redundant main wordline and the normal main wordline by simultaneously enabling the normal main wordline enable signal and the redundant main wordline enable signal in one test mode.

Moreover, by refreshing and testing the normal cell and the redundant cell at the same time in one test mode the test time for devices may be reduced, thereby reducing test expenses.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A refresh apparatus for a semiconductor memory device, comprising:
    an address multiplexer for generating a row address in response to a refresh request signal;
    a redundant cell refresh signal generator for generating a redundant cell refresh signal in response to the refresh request signal and a test mode signal;
    a wordline enable signal generator for generating a normal main wordline enable signal and a redundant main wordline enable signal in response to the redundant cell refresh signal in a redundant cell test mode; and
    a wordline driver circuit for simultaneously refreshing a normal cell and the redundant cell by simultaneously driving a normal main wordline and a redundant main wordline in response to the row address, the redundant cell refresh signal, the normal main wordline enable signal and the redundant main wordline enable signal in the redundant cell test mode.

2. The refresh apparatus according to claim 1, further comprising:
    an address buffer for buffering an external address, and generating an internal address;
    a refresh counter for generating a refresh address according to the refresh request signal; and
    a refresh address controller for generating an internal address latch signal for controlling the internal address and a refresh address latch signal for controlling the refresh address in response to the refresh request signal,
    the address multiplexer multiplexes the internal address and the refresh address, and generating the row address in response to the internal address latch signal and the refresh address latch signal.

3. The refresh apparatus according to claim 1, wherein the redundant cell refresh signal generator comprises:
    a first transistor having its source and drain connected respectively to a power voltage and a first node, and its gate connected to receive an inverted signal of a precharge signal;
    second and third transistors being connected in series between the first node and a ground voltage, and having their gates connected to receive the refresh request signal and the test mode signal, respectively;
    a latch circuit for latching the signal of the first node as an output signal; and
    first and second inverting devices for inverting the output signal from the latch circuit.

4. The refresh apparatus according to claim 1, wherein the wordline enable signal generator comprises:
    a first logic device for logically combining a repair signal and a redundant cell test mode signal;
    a first logic circuit for logically combining an output signal from the first logic device and a row active signal, and generating the normal main wordline enable signal;
    a second logic device for logically combining an inverted signal of the redundant cell refresh signal and the output signal from the first logic device; and
    a second logic circuit for logically combining an output signal from the second logic device and the row active signal, and generating the redundant main wordline enable signal.

5. The refresh apparatus according to claim 1, wherein the wordline driver circuit comprises:
    a normal predecoder for decoding the row address and a predecoder enable signal, and generating a predetermined number of decoded row address for driving the normal main wordline;
    a redundant predecoder for decoding the row address, the redundant cell refresh signal, the predecoder enable signal and a block select address in a redundant cell test mode, and generating a predetermined number of decoded row address for driving the redundant main wordline;
    a normal main wordline driver for driving the normal main wordline and refreshing the normal cell in response to the predetermined number of row address for driving the normal main wordline and the normal main wordline enable signal; and
    a redundant main wordline driver for driving the redundant main wordline and refreshing the redundant cell in response to the predetermined number of decoded row address for driving the redundant main wordline and the redundant main wordline enable signal.

6. The refresh apparatus according to claim 5, wherein the normal predecoder comprises:
    a first decoding unit for decoding first and second row address among the row address and the predecoder enable signal, and generating first to fourth decoded row address; and a second decoding unit for decoding third and fourth row address among the row address and the predecoder enable signal, and generating fifth to eighth decoded row address.

7. The refresh apparatus according to claim 5, wherein the redundant predecoder comprises:

a refresh block select unit for selecting a block to be refreshed in response to the redundant cell refresh signal and the block select address in the redundant cell test mode;

a first decoding unit for decoding an output signal from the refresh block select unit, the first and second row address among the row address and the predecoder enable signal, and generating first to fourth decoded row address for driving the redundant main wordline; and a second decoding unit for decoding the output signal from the refresh block select unit, the third and fourth row address among the row address and the predecoder enable signal, and generating the fifth to eighth decoded row address for driving the redundant main wordline.

8. The refresh apparatus according to claim 5, wherein the normal main wordline driver comprises:

a first transistor having its source and drain connected respectively to a power voltage and a first node, and its gate connected to receive an inverted signal of the precharge signal;

second to fourth transistors being connected in series between the first node and a ground voltage, and having their gates connected to receive the decoded row address for driving the normal main wordline and the normal main wordline enable signal; and a latch circuit for driving the normal main wordline by latching the signal of the first node.

9. The refresh apparatus according to claim 5, wherein the redundant main wordline driver comprises:

a first transistor having its source and drain connected respectively to a power voltage and a first node, and its gate connected to receive an inverted signal of the precharge signal;

second to fourth transistors being connected in series between the first node and a ground voltage, and having their gates connected to receive the decoded row address for driving the redundant main wordline and the redundant main wordline enable signal; and a latch circuit for driving the redundant main wordline by latching the signal of the first node.

10. A refresh method of a semiconductor memory device, comprising:

generating a row address in response to a refresh request signal;

generating a redundant cell refresh signal in response to the refresh request signal and a test mode signal;

generating a normal main wordline enable signal and a redundant main wordline enable signal in response to the redundant cell refresh signal in a redundant cell test mode; and simultaneously refreshing a normal cell and a redundant cell by simultaneously driving a normal main wordline and a redundant main wordline in response to the row address, the redundant cell refresh signal, the normal main wordline enable signal and the redundant main wordline enable signal in the redundant cell test mode.

11. The refresh method according to claim 10, further comprising:

generating an internal address by buffering an external address;

generating a refresh address according to the refresh request signal; and generating an internal address latch signal for controlling the internal address and a refresh address latch signal for controlling the refresh address in response to a row active signal and the refresh request signal, the row address is generated by multiplexing the internal address and the refresh address in response to the internal address latch signal and the refresh address latch signal.

12. The refresh method according to claim 10, wherein generating the decoded row address comprises:

decoding the row address and a predecoder enable signal, and generating a predetermined number of decoded row address for driving the normal main wordline among the decoded row address; and decoding the redundant cell refresh signal, the row address, the predecoder enable signal and a block select address, and generating a predetermined number of decoded row address for driving the redundant main wordline among the decoded row address.

13. The refresh method according to claim 10, wherein simultaneously driving the normal main wordline and the redundant main wordline comprises:

driving the normal main wordline in response to a predetermined number of decoded row address for driving the normal main wordline, the normal main wordline enable signal and a precharge signal; and driving the redundant main wordline in response to a predetermined number of decoded row address for driving the redundant main wordline, the redundant main wordline enable signal and the precharge signal.

* * * * *